US008482014B2

(12) United States Patent
Higuchi et al.

(10) Patent No.: US 8,482,014 B2
(45) Date of Patent: Jul. 9, 2013

(54) LIGHTING APPARATUS

(75) Inventors: Kazunari Higuchi, Yokohama (JP); Takayoshi Moriyama, Miura (JP); Sumio Hashimoto, Yokosuka (JP); Shinichi Kumashiro, Yokohama (JP); Yutaka Honda, Yokohama (JP); Kenji Nezu, Yokosuka (JP)

(73) Assignees: Toshiba Lighting & Technology Corporation, Kanagawa (JP); Kabushiki Kaisha Toshiba, Tokyo (JP)

( * ) Notice: Subject to any disclaimer, the term of this patent is extended or adjusted under 35 U.S.C. 154(b) by 260 days.

(21) Appl. No.: 12/582,721

(22) Filed: Oct. 21, 2009

(65) Prior Publication Data

US 2010/0038657 A1 Feb. 18, 2010

(30) Foreign Application Priority Data

Oct. 22, 2008 (JP) ................................ 2008-272281

(51) Int. Cl.
*H01L 33/00* (2010.01)

(52) U.S. Cl.
USPC ........................ 257/88; 257/98; 257/E33.068

(58) Field of Classification Search
USPC ...................................... 257/88, 98, E33.068
See application file for complete search history.

(56) References Cited

U.S. PATENT DOCUMENTS

| | | | | |
|---|---|---|---|---|
| 1,683,599 | A | 9/1928 | Percy | |
| 3,539,801 | A | 11/1970 | Bobrick | |
| 4,807,099 | A | 2/1989 | Zelin | |
| 4,963,798 | A | 10/1990 | McDermott | |
| 5,580,156 | A | 12/1996 | Suzuki et al. | |
| 6,196,707 | B1 | 3/2001 | Deckard | |
| 6,367,949 | B1 * | 4/2002 | Pederson | 362/240 |
| 6,527,411 | B1 | 3/2003 | Sayers | |
| 6,739,734 | B1 | 5/2004 | Hilgan | |
| 6,840,654 | B2 * | 1/2005 | Guerrieri et al. | 362/241 |
| 6,871,983 | B2 | 3/2005 | Jacob et al. | |
| 7,163,315 | B2 | 1/2007 | Chang et al. | |
| 7,241,019 | B1 | 7/2007 | Tsai | |
| 7,434,955 | B2 | 10/2008 | Vickers | |
| 7,566,154 | B2 | 7/2009 | Gloisten | |

(Continued)

FOREIGN PATENT DOCUMENTS

| | | |
|---|---|---|
| DE | 20 2004 001720 | 4/2004 |
| EP | 1 722 158 | 11/2006 |

(Continued)

OTHER PUBLICATIONS

English Abstract of JP 2006-172895 published Jun. 29, 2006.

(Continued)

*Primary Examiner* — Robert Huber
*Assistant Examiner* — Sheng Zhu
(74) *Attorney, Agent, or Firm* — DLA Piper LLP (US)

(57) ABSTRACT

A lighting apparatus is provided with a plurality of light-emitting devices, a substrate, a blind member, and a reflector. The reflector is formed with a plurality of reflective surfaces corresponding to the light-emitting devices, individually. The shielding angle at which light emitted from that one of the light-emitting devices which is located on the outermost periphery is intercepted by the reflective surface corresponding to the outermost light-emitting device is greater than shielding angles at which light emitted from the light-emitting devices located inside the outermost light-emitting device is intercepted by the reflective surfaces corresponding to the inside light-emitting devices.

5 Claims, 13 Drawing Sheets

U.S. PATENT DOCUMENTS

| | | | | |
|---|---|---|---|---|
| 7,604,365 | B2 | 10/2009 | Chang | |
| 7,676,915 | B2 | 3/2010 | Ter-Hovhannissian | |
| 7,794,114 | B2 | 9/2010 | Medendorp | |
| 8,025,424 | B2 | 9/2011 | Mondloch | |
| 2002/0093820 | A1 | 7/2002 | Pederson | |
| 2003/0081419 | A1 | 5/2003 | Jacob | |
| 2003/0137838 | A1 | 7/2003 | Rizkin et al. | |
| 2003/0156410 | A1* | 8/2003 | Ter-Hovhannisian | 362/241 |
| 2004/0208210 | A1 | 10/2004 | Inoguchi | |
| 2005/0128744 | A1 | 6/2005 | You | |
| 2005/0254241 | A1 | 11/2005 | Harwood | |
| 2006/0139942 | A1 | 6/2006 | Pond et al. | |
| 2007/0035951 | A1 | 2/2007 | Tseng | |
| 2007/0062032 | A1 | 3/2007 | Ter-Hovhannissian | |
| 2007/0097693 | A1 | 5/2007 | Klose | |
| 2007/0121328 | A1 | 5/2007 | Mondloch | |
| 2008/0043466 | A1 | 2/2008 | Chakmakjian | |
| 2008/0074889 | A1 | 3/2008 | Gloisten et al. | |
| 2008/0219000 | A1 | 9/2008 | Fan | |
| 2010/0181916 | A1 | 7/2010 | Mondloch | |

FOREIGN PATENT DOCUMENTS

| | | |
|---|---|---|
| EP | 1 818 607 | 8/2007 |
| EP | 2 034 234 | 3/2009 |
| GB | 2 365 962 | 2/2002 |
| JP | 2006-172895 | 6/2006 |
| JP | 2008-047541 | 2/2008 |
| JP | 2008-186776 | 8/2008 |
| JP | 2008-204692 | 9/2008 |
| JP | 2009-9826 | 1/2009 |
| JP | 2009-64637 | 3/2009 |

OTHER PUBLICATIONS

Machine Translation of JP 2006-172895 published Jun. 29, 2006.
English Abstract of JP 2008-204692 published Sep. 4, 2008.
Machine Translation of JP 2008-204692 published Sep. 4, 2008.
File History of related U.S. App. No. 12/470,223.
File History of related U.S. Appl. No. 12/757,623.
Chinese First Examination Notification issued Dec. 25, 2009 in CN 2008 101355481.
European Search Report dated Nov. 6, 2008 issued in EP 08163696.
English Language Abstract of JP 2009-064637 published Mar. 26, 2009.
Machine English Language Translation of JP 2009-064637 published Mar. 26, 2009.
English Language Abstract of JP 2009-009826 published Jan. 15, 2009.
Machine English Language Translation of JP 2009-009826 published Jan. 15, 2009.
File History of U.S. Appl. No. 12/717,154.
File History of U.S. Appl. No. 12/470,223.
File History of U.S. Appl. No. 12/818,871.
File History of U.S. Appl. No. 12/757,623.
File History of U.S. Appl. No. 12/757,664.
File History of U.S. Appl. No. 12/757,596.
File History of U.S. Appl. No. 12/205,460.
Extended European Search Report issued in EP 09006842 dated Aug. 10, 2010.
English Language Translation of DE 20 2004 001720 published Apr. 8, 2004.
English Abstract of EP 1,722,158 published Nov. 15, 2006.
Machine Translation of EP 1,722,158 published Nov. 15, 2006.
Extended Search Report issued in EP 10166378.9 on Oct. 6, 2010.
File History of related U.S. Appl. No. 12/470,223.
Supplementary European Search Report issued in EP 10002139.3, dated Apr. 27, 2012.
European Search Report issued in EP 09013238 on Nov. 21, 2011.
File History of related U.S. Appl. No. 12/757,664.
File History of related U.S. Appl. No. 12/757,596.
English language abstract of JP-2008-186776, Published Aug. 14, 2008.
Machine English language translation of JP-2008-186776, Published Aug. 14, 2008.
Japanese Office Action issued in JP 2009-052118 on Nov. 7, 2012.
English Language Translation of Japanese Office Action issued in JP 2009-052118 on Nov. 7, 2012.
English Language Abstract of JP 2008-047541 published Feb. 28, 2008.
English Language Translation of JP 2008-047541 published Feb. 28, 2008.
Chinese Office Action issued in CN 201010129123.7 on Sep. 28, 2012.
English Language Translation of Chinese Office Action issued in CN 201010129123.7 on Sep. 28, 2012.
File History of related U.S. Appl. No. 12/717,154.
Chinese Office Action issued in CN 200910206611 mailed Jul. 26, 2012.
English Language Translation of Chinese Office Action issued in CN 200910206611 mailed Jul. 26, 2012.
Chinese Office Action issued in CN 201010207332.9 dated Aug. 31, 2012.
English Language Translation of Chinese Office Action issued in CN 201010207332.9 dated Aug. 31, 2012.
File History of related U.S. Appl. No. 12/818,871.
Partial File History of related U.S. Appl. No. 12/717,154 electronically captured from PAIR on Mar. 28, 2013 between Jan. 28, 2013 through Mar. 28, 2013.
Partial File History of related U.S. Appl. No. 12/818,871 electronically captured from PAIR on Mar. 28, 2013 between Jan. 28, 2013 through Mar. 28, 2013.
Japanese Office Action issued in JP 2009-243071 on Apr. 23, 2013.
English language Translation of Japanese Office Action issued in JP 2009-243071 on Apr. 23, 2013.
English Language Abstract of JP 62-123012 published Jun. 4, 1987.
English Language Abstract of JP 2008-159562 published Jul. 10, 2008.
English Language Translation of JP 2008-159562 published Jul. 10, 2008.
Partial File History of related U.S. Appl. No. 12/818,871 electronically captured from PAIR on Jun. 7, 2013 between Mar. 7, 2013 and Jun. 7, 2013.
Partial File History of related U.S. Appl. No. 12/717,154 electronically captured from PAIR on Jun. 7, 2013 between Mar. 7, 2013 and Jun. 7, 2013.

* cited by examiner

LIGHTING APPARATUS

CROSS-REFERENCE TO RELATED APPLICATIONS

This application is based upon and claims the benefit of priority from prior Japanese Patent Application No. 2008-272281, filed Oct. 22, 2008, the entire contents of which are incorporated herein by reference.

BACKGROUND OF THE INVENTION

1. Field of the Invention

The present invention relates to a lighting apparatus using light-emitting devices, such as LEDs, as its light sources and having improved light shielding properties.

2. Description of the Related Art

Lighting apparatuses have been developed that use light-emitting devices, such as LEDs, as their light sources. A lighting apparatus provided with light-emitting diodes (LEDs) and reflector is described in Jpn. Pat. Appln. KOKAI Publication No. 2008-186776. The LEDs for use as light sources are arranged concentrically at regular intervals on a substrate. The reflector has reflective surfaces corresponding to the LEDs, individually.

A lighting apparatus with LEDs is expected to be highly luminous and produce high output power. To this end, the lighting apparatus of this type is provided with an increasing number of LEDs. However, each LED is liable to cause glare, since it is a point light source, as well as being highly directional and able to emit highly luminous light.

BRIEF SUMMARY OF THE INVENTION

The present invention provides a lighting apparatus having improved light shielding properties that lead to a reduction in glare.

The lighting apparatus comprises a plurality of light-emitting devices, a substrate, a blind member and a reflector. The substrate has the light-emitting devices located on the light projection side thereof. The blind member encloses the outer periphery of the light-emitting devices. The reflector is formed with a plurality of reflective surfaces corresponding to the light-emitting devices, individually. The shielding angle at which light emitted from that one of the light-emitting devices which is located on the outermost periphery is intercepted by the reflective surface corresponding to the outermost light-emitting device is greater than shielding angles at which light emitted from the light-emitting devices located inside the outermost light-emitting device is intercepted by the reflective surfaces corresponding to the inside light-emitting devices.

If the light-emitting devices of the lighting apparatus are located on the same plane perpendicular to directions of emission of the lights from the light-emitting devices, elevation angles at which the individual light-emitting devices are viewed from an observation point, which is distant at right angle to the light emission direction of the light apparatus, become smaller with distance from the observation point. In the lighting apparatus of the invention, the shielding angle of the reflective surface corresponding to the outermost light-emitting device is greater than those of the reflective surfaces corresponding to the inside light-emitting devices. Thus, the light emitted from the outermost light-emitting device that is located closest to the observation point, if the lighting apparatus is viewed in any direction, can be intercepted earlier by the reflective surface corresponding to the outermost light-emitting device than the light emitted from the inside light-emitting devices.

The light-emitting devices are located on a plurality of concentric circles with different radii. Since the light-emitting devices are arranged concentrically, the shielding angles can easily be set for the reflective surfaces corresponding to the individual light-emitting devices.

The shielding angle at which the light emitted from the outermost light-emitting device toward the center of the light-emitting devices is intercepted by the reflective surface corresponding to the outermost light-emitting device is greater than or substantially equal to a shielding angle at which the light emitted from the light-emitting device located inside the outermost light-emitting device toward the center of the light-emitting devices is intercepted by the blind member. When the observation point is moved away from the center of the lighting apparatus with this arrangement, the light emitted from the outermost light-emitting device, as viewed across the center of the light-emitting devices, can be intercepted earlier by the reflective surface corresponding to the outermost light-emitting device than the light emitted from the inside light-emitting devices intercepted by the blind member.

The blind member is constructed by connecting a plurality of members in a direction away from a light projection side of the substrate. Since the blind member is constructed by connecting the plurality of members, the length of the blind member can be freely changed depending on an installation structure for the lighting apparatus and required light distribution properties.

The reflective surface corresponding to the outermost light-emitting device and the blind member are formed relative to an observation point distant at right angles to directions of emission of lights from the light-emitting devices on the following condition: the light emitted from the light-emitting device located on the outermost periphery within a range farther from the observation point than the center of the light-emitting devices is intercepted by the reflective surface corresponding to the outermost light-emitting device when the light emitted from the light-emitting device located on the inside periphery within the range farther from the observation point than the center of the light-emitting devices is intercepted by the blind member.

If the observation point is somewhat distant from the lighting apparatus, the light emitted from the light-emitting devices located within a range near the observation point is intercepted by the blind member. In other words, the light emitted from the light-emitting devices located farther from the observation point than the center of the light-emitting devices is not intercepted by the blind member. If the lights from the light-emitting devices are highly directional, the light from light-emitting devices may sometimes reach a position distant from the lighting apparatus. The more distant from the lighting apparatus the observation point is, the smaller the elevation angle at which the lighting apparatus is viewed from the observation point is. Thus, it becomes sensitive about glare.

In the lighting apparatus in an aspect of the invention, the reflective surfaces and blind member are formed in the manner described above, so that the glare of the outermost light-emitting device located across the center of the light-emitting devices is intercepted by the reflective surface corresponding to the outermost light-emitting device the moment the glare of the inside light-emitting devices are intercepted by the blind member. Thus, the lighting apparatus can reduce the glare.

The light-emitting devices include solid-state light-emitting elements, such as LEDs or organic EL devices. The light-emitting devices should preferably be mounted by the chip-on-board method or surface mounting method. However, the present invention, by its nature, is not limited to any special mounting method. Further, there are no special restrictions on the number of mounted light-emitting devices or the substrate shape. The substrate shape may, for example, be circular, rectangular, or polygonal. The "concentric circles" used herein need not be geometrically precise. The "outer periphery of the light-emitting devices" represents the outer periphery of a light-emitting device group composed of a plurality of light-emitting devices, not that of each individual light-emitting device. Therefore, the "light-emitting device on the outermost periphery" represents the one that is most distant from the center of the light-emitting device group. Further, the "center of the light-emitting devices" represents the center of the light-emitting device group, not that of each individual light-emitting device. Furthermore, the "light-emitting device on the innermost periphery" represents the one that is closest to the center of the light-emitting device group.

The shielding angles at which the lights emitted from the individual light-emitting devices are intercepted by the reflective surfaces corresponding to the light-emitting devices may be set so that they gradually increase with distance from the inner periphery.

Further, the "elevation angle" used herein represents an angle at which the light-emitting devices are looked into off the plane perpendicular to the light emission directions of the lighting apparatus. Therefore, the elevation angle is not limited to the one at which the light-emitting devices of the lighting apparatus are looked up from the observation point on the plane perpendicular to the light emission directions of the lighting apparatus which is installed on a ceiling.

Thus, according to the present invention, there is provided a lighting apparatus having improved light shielding properties that lead to a reduction in glare.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
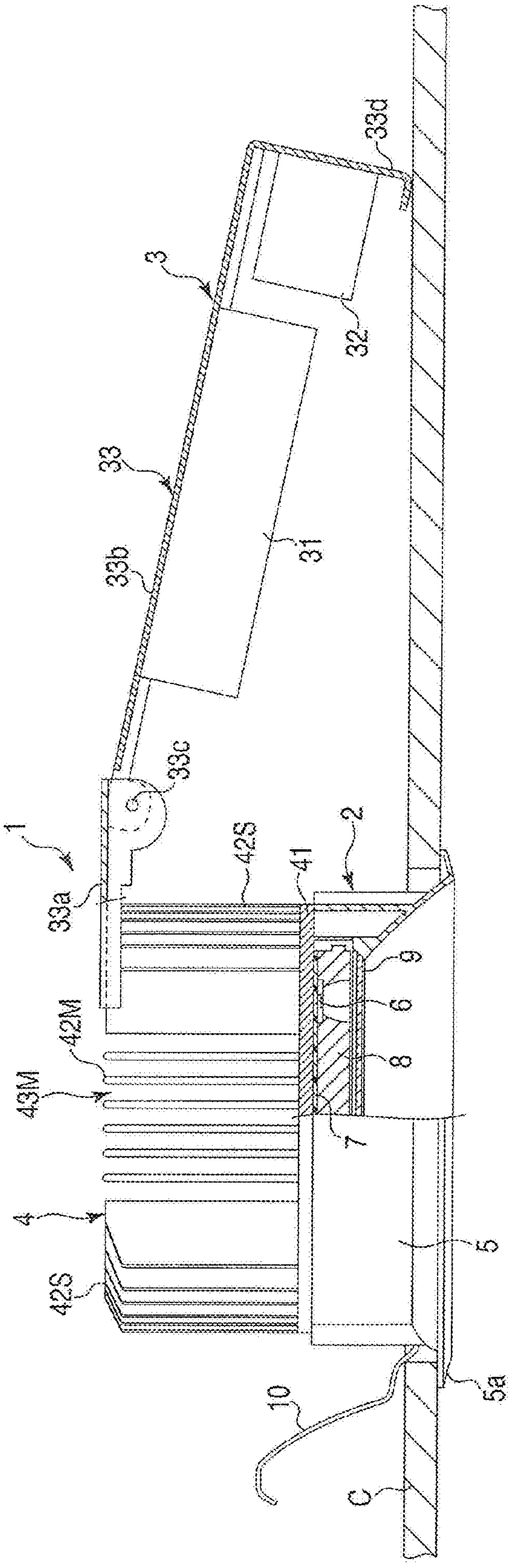
FIG. 1 is a side view, partially in section, showing a lighting apparatus according to a first embodiment of the invention installed on a ceiling.
Figure 2:
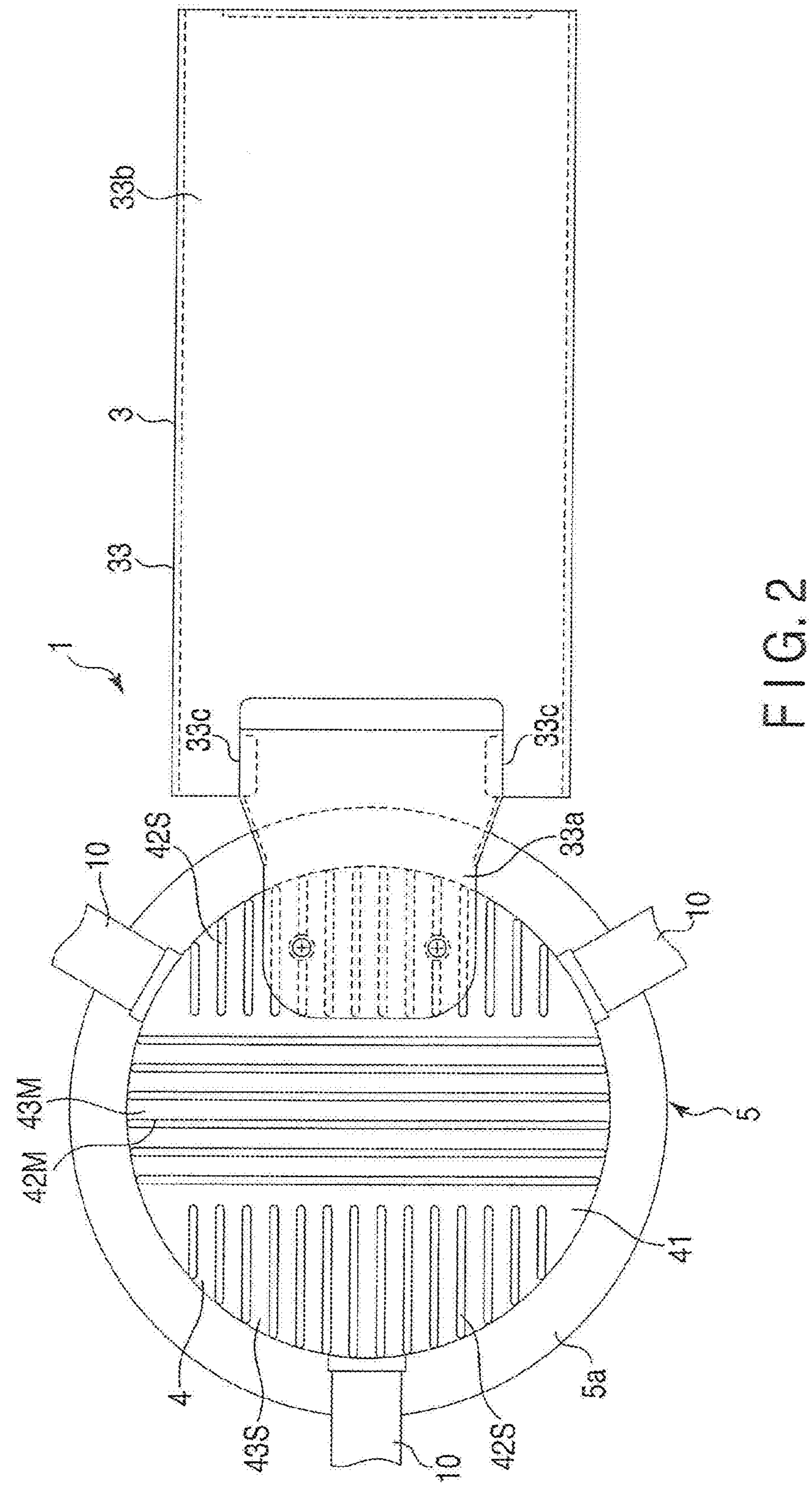
FIG. 2 is a top view of the lighting apparatus shown in FIG. 1.
Figure 3:
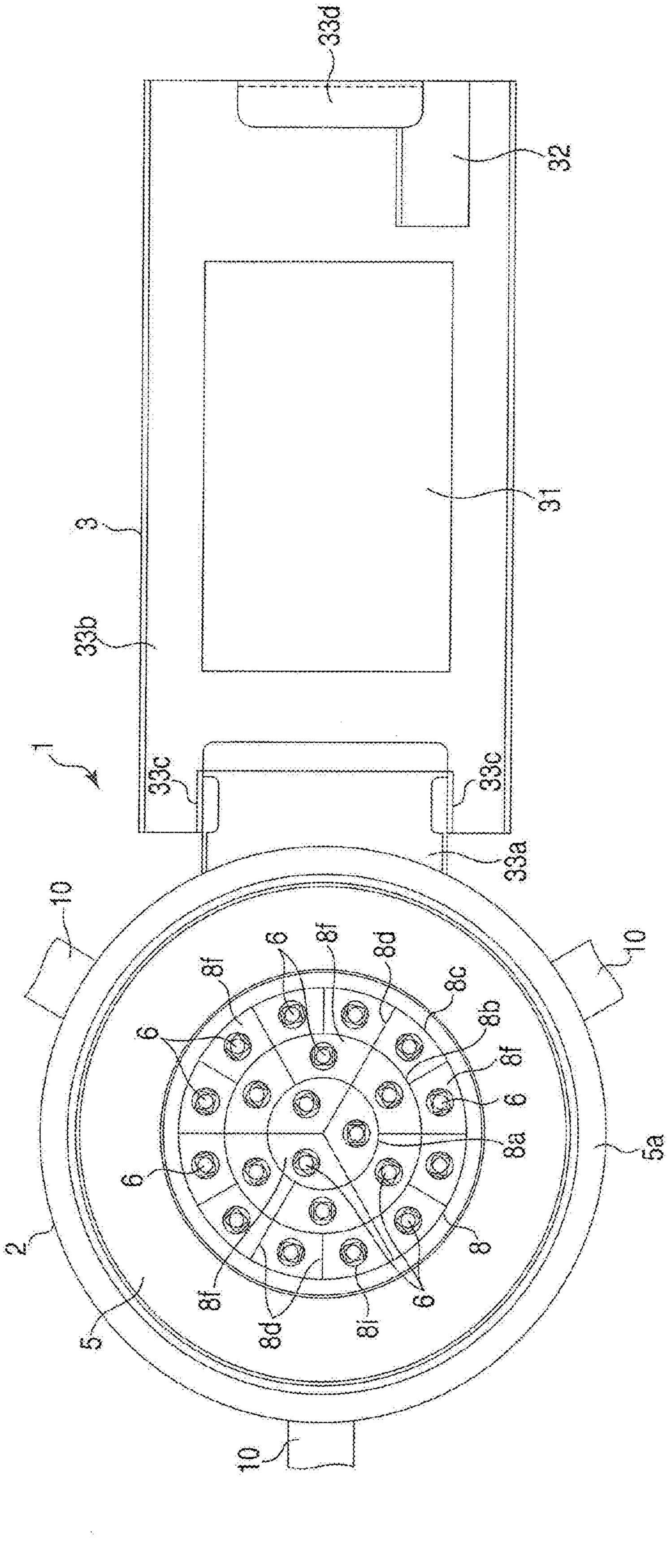
FIG. 3 is a bottom view of the lighting apparatus shown in FIG. 1.

A lighting apparatus 1 according to a first embodiment of the present invention will now be described with reference to FIGS. 1 to 7D. FIGS. 1 to 3 show a down-light of a type embedded in a ceiling C, as an example of the lighting apparatus 1. The lighting apparatus 1 is provided with a light source unit 2 and power source unit 3 connected to each other. The light source unit 2 includes a thermal radiator 4, blind member 5, LEDs 6, substrate 7, reflector 8, and translucent cover 9. In the description herein, the side on which lights are emitted is sometimes referred to as "front" or "obverse"; the opposite side, as "back" or "reverse"; and a direction across the direction of light emission, as "lateral" or "transverse".

As shown in FIGS. 1 and 2, the radiator 4 is a so-called heat sink for use as thermal radiation means of the lighting apparatus 1. The radiator 4 is formed of a highly thermally conductive material, such as a die casting of aluminum alloy. The outer surface of the radiator 4 is finished by baking a white melamine-based paint. The radiator 4 may be formed of any other suitable material that assures thermal conductivity. The radiator 4 is composed of a disk-like base 41 and a plurality of radiator fins 42 extending vertically from the back of the base 41. The radiator fins 42 include main radiator fins 42M and sub-radiator fins 42S.

The main radiator fins 42M are arranged parallel to the diameter of the base 41. End portions of each main radiator fin 42M extend to the outer peripheral edge of the base 41. Each fin 42M is a rectangular plate. The main radiator fins 42M are arranged with regular gaps 43M between them. The sub-radiator fins 42S extend vertically from the base 41, parallel to the diameter of base 41 and at right angles to the main radiator fins 42M. One end portion of each sub-radiator fin 42S extends to the outer peripheral edge of the base 41, and the other end portion is located slightly apart from the main radiator fins 42M. Like the main radiator fins 42M, moreover, the sub-radiator fins 42S are arranged at regular intervals 43S.

The blind member 5 is formed of Acrylonitrile-Butadiene-Styrene (ABS) resin or a die casting of aluminum alloy and has an umbrella-like shape that spreads like a parabolic surface in the direction of light emission. A large-diameter side end of the blind member 5 has an annular flange 5*a* as a decorative frame, which outwardly spreads at right angles to the emission direction. A small-diameter side end of the blind member 5 is fixed to the radiator 4. The blind member 5 is located so as to surround the outer periphery of the LEDs 6 that are mounted on a light-projection surface of the substrate 7. The blind member 5 is assembled to the radiator 4 with the reflector 8 and translucent cover 9 between them. The blind member 5 has a function to reduce the overall glare of lights emitted from the lighting apparatus 1. As shown in FIG. 3, moreover, the blind member 5 is provided with mounting members 10 arranged at intervals of 120°. The lighting apparatus 1 is attached to the ceiling C by the mounting members 10.

Figure 6:
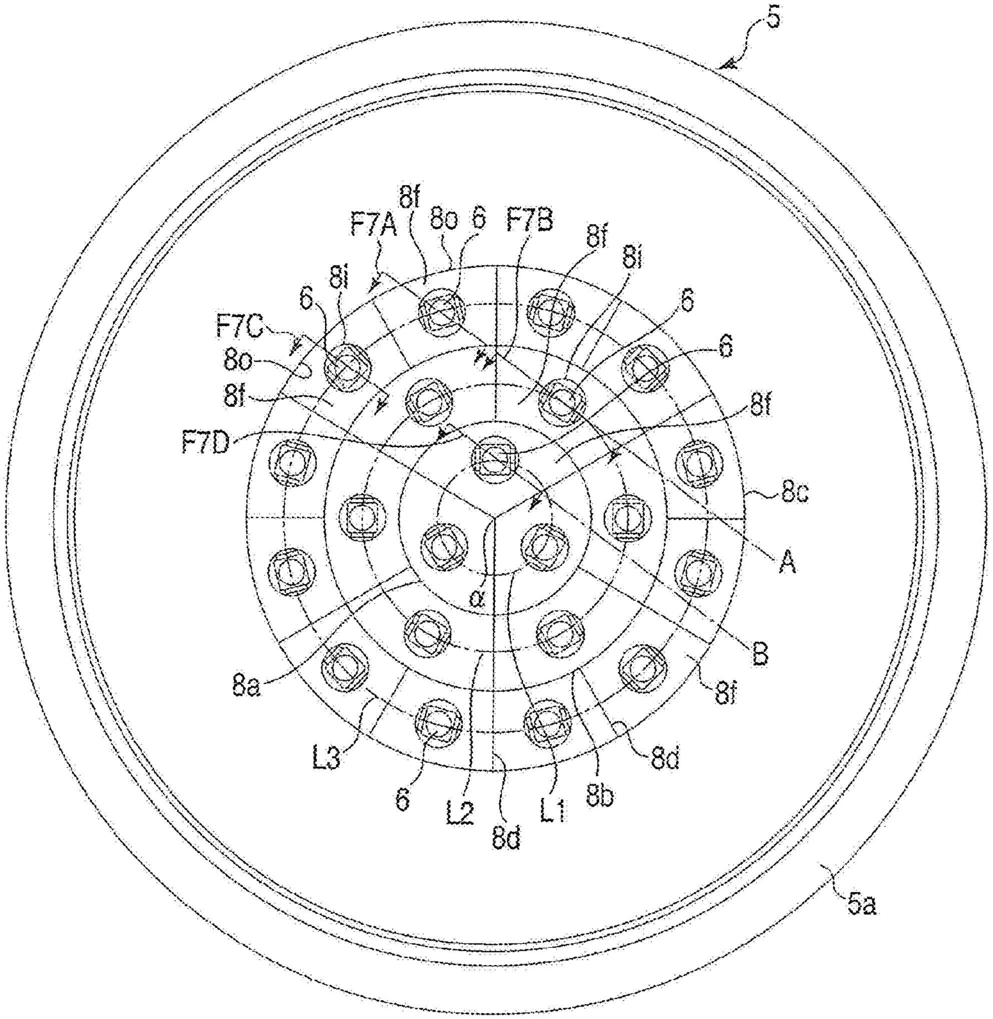
FIG. 6 is a bottom view of the lighting apparatus shown in FIG. 1.

The LEDs 6 are an example of light-emitting devices. As shown in FIG. 1, the LEDs 6 are mounted on the obverse side or light-projection side of the substrate 7 by the surface mounting method. As shown in FIGS. 3 and 6, the specific number of LEDs 6 is 21 in total. The LEDs 6 are distributed on a plurality of concentric circles (three in the present embodiment) with different radii. More specifically, three LEDs 6 are located on an innermost circle L1, six on a middle or second circle L2, and twelve on an outermost circle L3.

The substrate 7 is a flat circular plate of epoxy resin that contains fiberglass. As shown in FIG. 1, the LEDs 6 are mounted on the obverse side of the substrate 7, and the reverse side closely contacts the base 41 of the radiator 4. The central portion of the substrate 7 is attached to the radiator by screws (not shown) that penetrate it from the obverse side. Thus, the radiator 4 is thermally coupled to the substrate 7 by being brought into contact with the reverse surface of the substrate.

In order to enhance the adhesion between the base 41 of the radiator 4 and the reverse surface of the substrate 7, for example, a thermally conductive silicone sheet or highly thermally conductive paste or adhesive may be inserted between the base and substrate. Specifically, a material whose thermal conductivity is improved by mixing a silicone-based base material with a metal oxide or the like by kneading is used as the paste or adhesive. If an insulating material is to be used for the substrate 7, moreover, it may be a highly durable ceramic or plastic material with relatively good thermal radiation properties. If a metallic material is to be used for the substrate 7, it should preferably be aluminum or some other material that has good thermal conductivity and thermal radiation properties.

Figure 4:
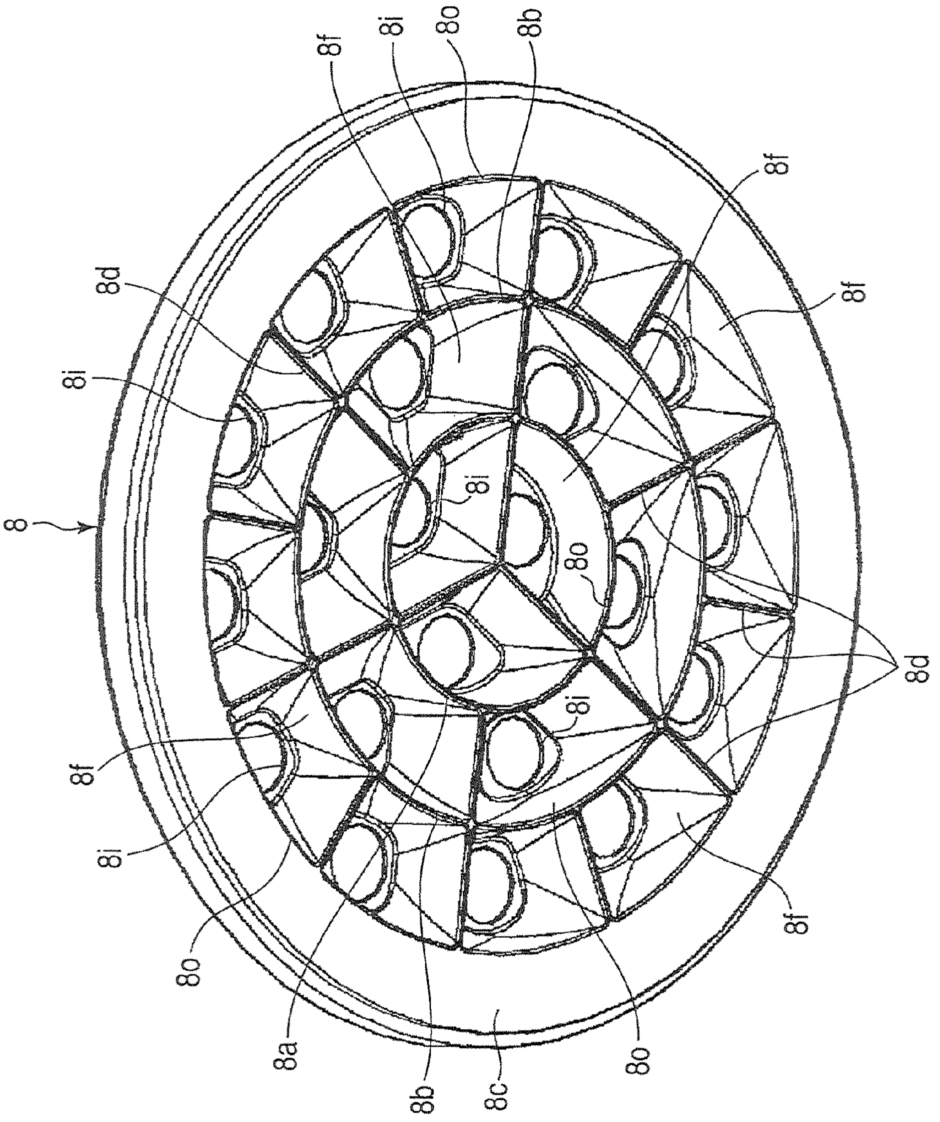
FIG. 4 is a perspective view of a reflector of the lighting apparatus shown in FIG. 1.

As shown in FIG. 4, the reflector 8 is located on the obverse side of the substrate 7. The reflector 8 is formed of white polycarbonate or Acrylonitrile-Styrene-Acrylate (ASA) resin or the like. The reflector 8 has a function to control the distribution of lights emitted from the LEDs 6 to ensure efficient irradiation. The reflector 8 has a disk-like external shape having substantially the same diameter as that of the substrate 7. The reflector 8 has incident apertures **8*i* as many as the LEDs 6, that is, 21 apertures. The incident apertures 8*i* are divided by a first separating wall 8*a*, second separating wall 8*b*, outer peripheral edge portion 8*c*, and third separating walls 8*d***.

The first and second separating walls **8*a* and 8*b* and outer peripheral edge portion 8*c* are arranged concentrically from the central portion to the outer periphery in the order named. The first separating wall 8*a* surrounds the respective outer peripheries of the incident apertures 8*i* corresponding to those LEDs 6 which are located on the innermost circle L1. The second separating wall 8*b* surrounds the respective outer peripheries of the LEDs 6 located on the second circle L2. The outer peripheral edge portion 8*c* surrounds the respective outer peripheries of the LEDs 6 located on the outermost circle L3. The third separating walls 8*d*, which extend radially from the center of the reflector 8, are located between the center of the reflector 8 and first separating wall 8*a*, between the first and second separating walls 8*a* and 8*b*, and between the second separating wall 8*b* and outer peripheral edge portion 8*c*. The third separating walls 8*d* divide the incident apertures 8*i* corresponding to the LEDs 6** on the same circle.

Emission apertures **8*o* of the reflector 8 are defined individually by the respective ridges of the first separating walls 8*a*, second separating walls 8*b*, outer peripheral edge portion 8*c*, and third separating walls 8*d*. The separating walls 8*a*, 8*b* and 8*d* and outer peripheral edge portion 8*c* corresponding to the incident apertures 8*i* form bowl-shaped reflective surfaces 8*f* between the incident apertures 8*i* and emission apertures 8*o*. The reflective surfaces 8*f* corresponding individually to the LEDs 6 are spread so that the emission apertures 8*o* are shaped along the respective ridges of the separating walls. Consequently, the reflector 8 is formed with the reflective surfaces 8*f* corresponding to the LEDs 6**, individually.

The translucent cover 9 is located on the emission-aperture side of the reflector 8. The cover 9 may be a glass cover that protects the reflective surfaces **8*f* and LEDs 6 or one that is somewhat opacified to be able to diffuse the lights emitted from the LEDs 6. In the present embodiment, the translucent cover 9 is held by the blind member 5, as shown in FIG. 1**.

The power source unit 3 is provided with a power circuit 31, power terminal block 32, and arm-like mounting member 33. The mounting member 33 is composed of an attaching portion **33*a* coupled to the light source unit 2, mounting portion 33*b* for holding the power circuit 31 and power terminal block 32, hinges 33*c* that connect the attaching portion 33*a* and the mounding portion 33*b*, and a support leg 33*d* formed at the end of the mounting member 33 farther from the hinges 33*c*. The attaching portion 33*a* of the mounting member 33 is mounted on the respective upper edges of some of the sub-radiator fins 42S by screws or other fastening means. The power circuit 31 that includes a power circuit board is attached to that part of the mounting portion 33*b* which faces down when the lighting apparatus 1 is fixed to the ceiling C. Electronic components, including a control IC, transformer, capacitor, etc., are mounted on the power circuit board. The power circuit board is electrically connected to the substrate 7 on which the LEDs 6 are mounted. The LEDs 6 are on/off-controlled by the power circuit 31. The power terminal block 32 is attached to that part of the lower surface of the mounting portion 33*b* which is located farther from the light source unit 2 than the power circuit 31. The commercial power supply is connected to the power terminal block 32 to supply electric power to the power circuit 31**.

The lighting apparatus 1, a down-light, is inserted into an embedding hole C1 in the ceiling C from the side of the power source unit 3 and is embedded and supported in the ceiling C. Since the flange **5*a* is larger in diameter than the embedding hole C1 of the ceiling C, it is caught by the edge of the hole C1 from below when the lighting apparatus 1 is installed on the ceiling C. A support leg 33*d* contacts the reverse side of the ceiling C, thereby supporting the mounting member 33**.

Figure 5:
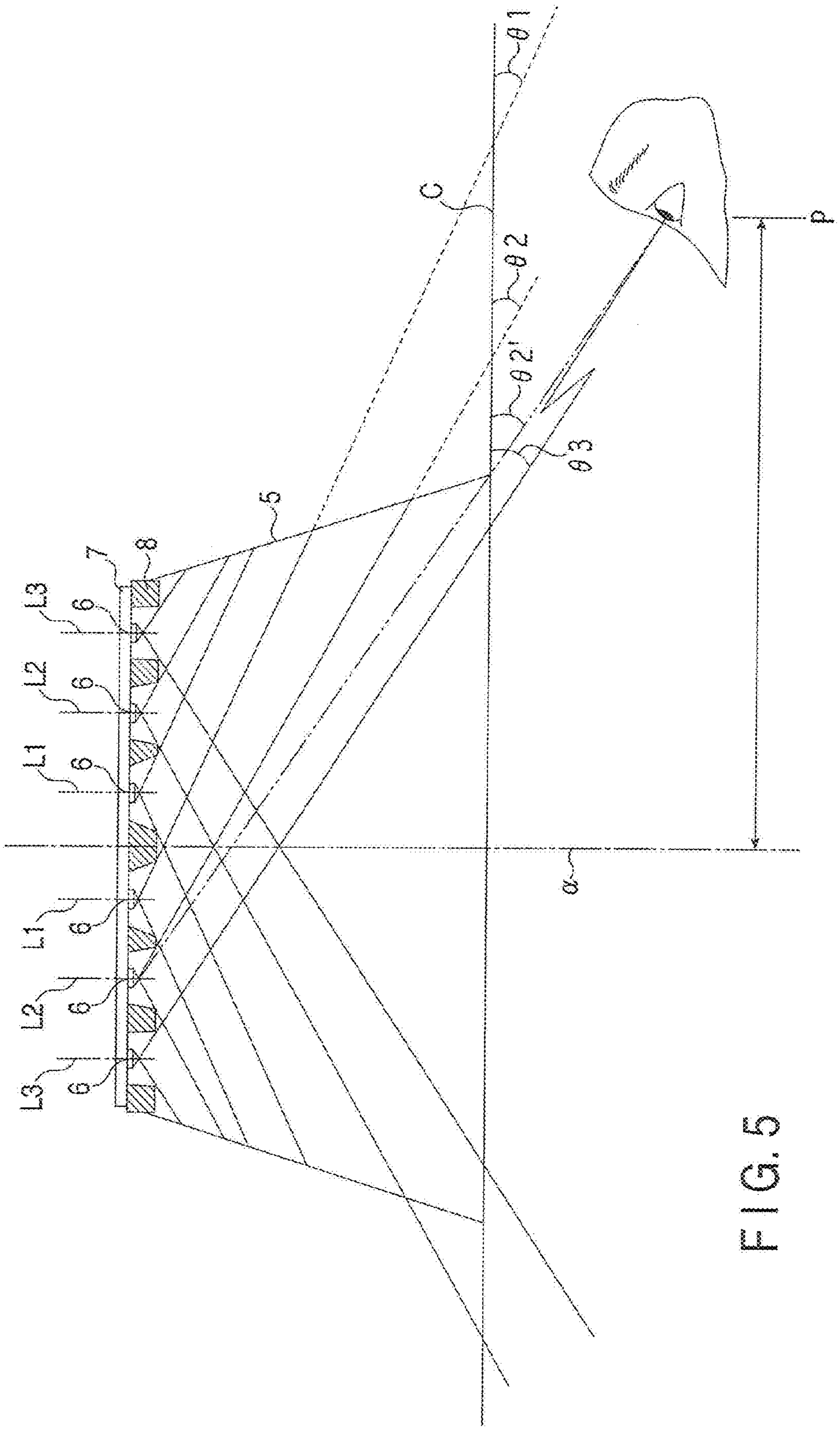
FIG. 5 is a diagram typically showing the light shielding properties of the lighting apparatus shown in FIG. 1.

The light shielding properties of the lighting apparatus 1 of the present embodiment will now be described with reference to FIGS. 5 to 7D. FIG. 5 typically shows the relationships between the LEDs 6, which are located on the three concentric circles L1 to L3, the reflective surfaces **8*f* corresponding to the LEDs 6, the blind member 5, and an observation point P. In the lighting apparatus 1 according to the present embodiment, as seen from FIG. 6, no lines of LEDs 6 are straight when viewed from any observation point. FIG. 5** is only a conceptual diagram for illustrating a technical idea.

Prerequisites for explaining the light shielding properties will be described first. The lighting apparatus 1 is installed on the ceiling C. The LEDs 6 for use as light sources are arranged along the three concentric circles L1 to L3 with different radii, around a center line α for the lights emitted from the lighting apparatus 1, on the substrate 7. The reflector 8 having the reflective surfaces 8*f* corresponding to the LEDs 6 are located on the projection side of the substrate 7. The blind member 5 is located on the projection side of the substrate 7 so as to surround the respective outer peripheries of the LEDs 6. The blind member 5 intercepts the lights emitted from the lighting apparatus 1. The lights emitted from the LEDs 6 arranged on the circles L1 to L3 are distribution-controlled by their corresponding reflective surfaces 8*f*, that is, shielding angles θ1 to θ3 are set.

Let us suppose that the lighting apparatus 1 is not provided with the blind member 5 and that the shielding angles θ1 to θ3 of the LEDs 6 on the circles L1 to L3 are all equal. When the observation point P is moved away from the position just below the lighting apparatus 1, in this case, the light emitted from LED 6 is intercepted successively by the reflective surfaces 8*f* corresponding to the LEDs 6, starting with the LED 6 farthest from the observation point P, that is, the LED 6 on the circle L3 on the side beyond the center line α with respect to the observation point. The light emitted from one of the LEDs 6 on the outermost circle which is located closest to the observation point P is intercepted by the reflective surface 8*f* at the shielding angle θ3.

If the lighting apparatus 1 is not provided with the reflector 8 and if the blind member 5 attached to the apparatus 1 is sufficiently long, the light emitted from that LED 6 on the circle L3 which is located closest to the observation point P is first intercepted, and the lights emitted from the LEDs 6 on the inner circles L1 and L2 are then intercepted by the blind member 5. The light emitted from the LEDs 6 on the outermost circle L3 can be intercepted at the last. Therefore, the lights emitted from the LEDs 6 on the outermost circle L3 are liable to be seen even from the distant observation point P. Possibly, the blind member 5 may be extended in the hanging direction so that the lights emitted from the LEDs 6 on the circle L3 can also be intercepted by the blind member. If this is done, however, the lighting apparatus 1 is inevitably enlarged, and the light distribution properties are completely changed.

In the present embodiment, as shown in FIG. 5, the respective shielding angles θ of the reflective surfaces 8*f* corresponding to the LEDs 6 are set so that they increase with distance from the center, covering the circles L1 to L3 in the order named. Thus, the shielding angles θ are set so that θ3>θ2>θ1. In particular, the shielding angle θ3 of the LED 6 on the outermost circle L3 that cannot easily be intercepted by the blind member 5 is set to be greater than the shielding angles θ1 and θ2 of the LEDs 6 on the inner circles L1 and L2. The range in which the glare emitted from the LEDs 6 on the circle L3 is in sight is reduced when the lighting apparatus 1 is viewed from the observation point P. Thus, the glare of the lighting apparatus 1 can be reduced. Thereupon, it is necessary only that the shielding angle θ3 of the reflective surface 8*f* corresponding to the LED 6 on the outermost circle L3 be at least greater than the shielding angles θ1 and θ2 of the reflective surfaces 8*f* corresponding to the LEDs 6 on the inner circles L1 and L2. In other words, the shielding angles should only be set so that θ3>θ2 and θ3>θ1 are satisfied.

As shown in FIG. 5, moreover, a shielding angle θ2' is defined as an angle at which the light emitted from the LED 6 on the circle L2 inside the outermost circle L3 is intercepted by the blind member 5. In the present embodiment, it is necessary only that the light emitted from that LED 6 on the circle L3 which is located farthest from the observation point P be intercepted substantially simultaneously with the light emitted from the LED 6 on the inner circle L2, when viewed from the observation point P. Hence, the shielding angle θ2' equals to the shielding angle θ3 in the shielding angle for the observation point P. The LED 6 on the circle L2 is a little closer to the observation point P than that on the circle L3. Therefore the shielding angle θ2' is technically grater than the shielding angle θ3.

Figure 7A:
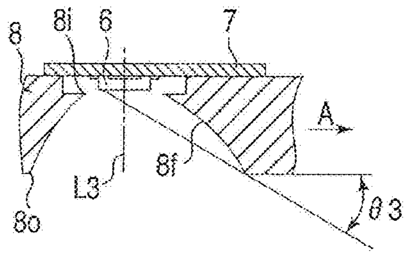
FIG. 7A is a sectional view of the reflector and an LED taken along line F7A of FIG. 6.
Figure 7B:
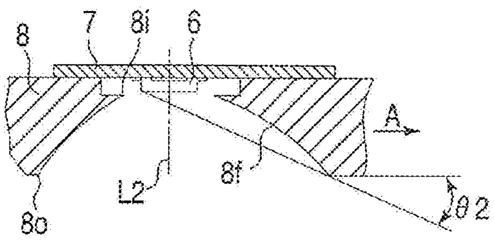
FIG. 7B is a sectional view of the reflector and another LED taken along line F7B of FIG. 6.
Figure 7C:
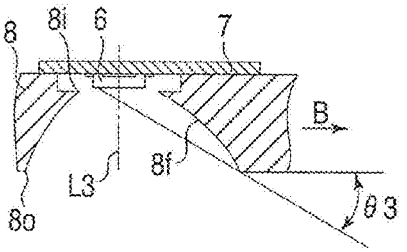
FIG. 7C is a sectional view of the reflector and another LED taken along line F7C of FIG. 6.
Figure 7D:
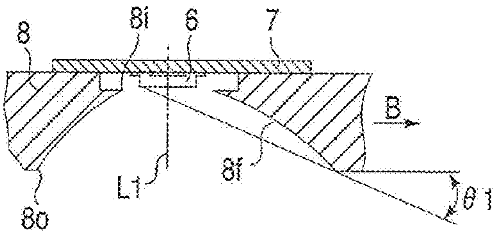
FIG. 7D is a sectional view of the reflector and another LED taken along line F7D of FIG. 6.

Referring to FIGS. 6 and 7A to 7D, the relations between the shielding angles θ1 to θ3 will be described specifically. FIG. 6 is a plan view showing the reflector 8. FIG. 7A is a sectional view of the reflector 8 taken along line F7A of FIG. 6. FIG. 7B is a sectional view of the reflector 8 taken along line F7B of FIG. 6. FIG. 7C is a sectional view of the reflector 8 taken along line F7C of FIG. 6. FIG. 7D is a sectional view of the reflector 8 taken along line F7D of FIG. 6. Lines F7A to F7D are provided based on an assumption that the lighting apparatus 1 is viewed from the observation point P on an extension of direction A or B.

The LEDs 6 are arranged on the three concentric circles L1 to L3 with different radii. The relations between the shielding angles θ1 to θ3 formed by the reflective surfaces 8*f* corresponding to the LEDs 6 are set to be θ3>θ2>θ1. FIGS. 7A and 7C show a profile of the reflective surface 8*f* corresponding to the LED 6 on the third circle L3, along with the LED 6. FIG. 7B shows a profile of the reflective surface 8*f* corresponding to the LED 6 on the second circle L2, along with the LED 6. Further, FIG. 7D shows a profile of the reflective surface 8*f* corresponding to the LED 6 on the first or innermost circle L1, along with the LED 6.

The reflective surfaces 8*f* shown in FIGS. 7A and 7C are adjusted to the shielding angle θ3. Further, the reflective surfaces 8*f* shown in FIGS. 7B and 7D are adjusted to the shielding angles θ2 and θ1, respectively. The range in which the glare emitted from the LEDs 6 on the outermost circle L3 is in sight is reduced when the lighting apparatus 1 is viewed from the observation point P on the extension of direction A or B in FIG. 6. Thus, the glare is reduced.

Figure 8:
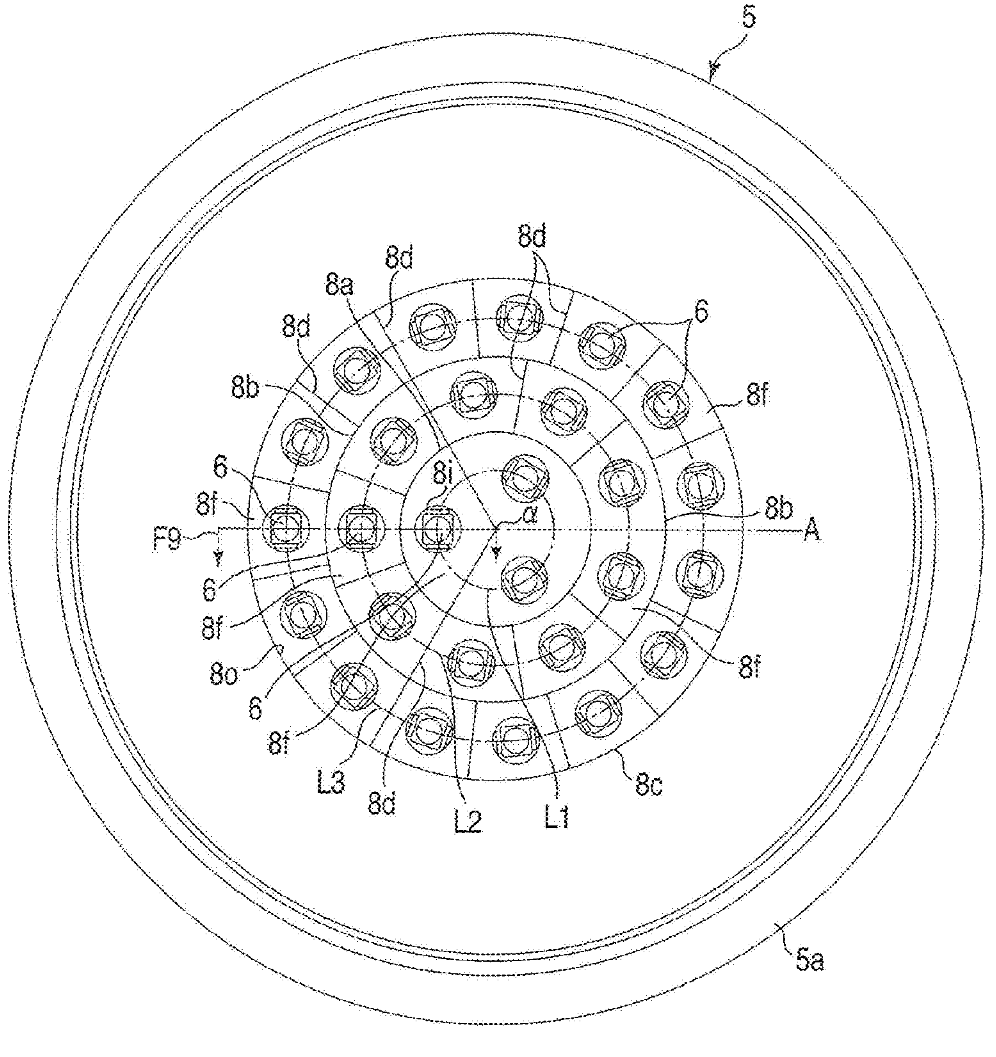
FIG. 8 is a bottom view showing another embodiment in which LEDs are arranged differently from those of the lighting apparatus shown in FIG. 1.
Figure 9:
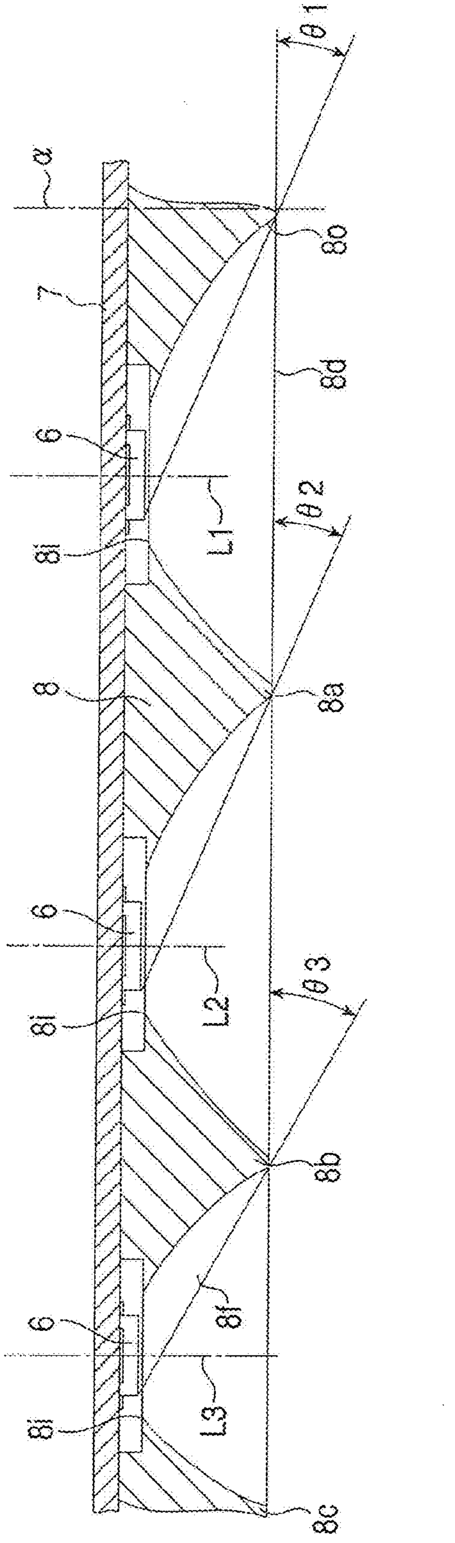
FIG. 9 is a sectional view of a reflector and LED taken along line F9 of FIG. 8.

A lighting apparatus 1 according to an alternative embodiment, having LEDs 6 arranged differently, will now be described with reference to FIGS. 8 and 9. FIG. 8 is a plan view showing a reflector 8. FIG. 9 is a sectional view of the reflector 8 taken along line F9 of FIG. 8. In this case, the lighting apparatus 1 is assumed to be viewed from an observation point P on an extension of direction A in FIG. 8. The LEDs 6 are arranged on three concentric circles L1 to L3 with different radii. As shown in FIG. 8, there are 27 LEDs 6 in total, and they are located on a substrate 7. Three LEDs 6 are arranged at regular pitches on a circle L1, nine on a circle L2, and fifteen on a circle L3. The relations between shielding angles θ1 to θ3 of the reflective surfaces 8*f* corresponding to the LEDs 6 are set to be θ3>θ2>θ1. Also in the case where the LEDs 6 are arranged in the manner shown in FIG. 9, the range in which lights emitted from the LEDs 6 on the outermost circle L3 are in sight can be reduced. Thus, the glare of the lighting apparatus 1 can be reduced.

In the configuration described above, a lighting circuit is powered for supplying electric power to the substrate 7 when a power source unit 3 is energized, whereupon the LEDs 6 emit lights. Many of the lights emitted from the LEDs 6 are transmitted through the translucent cover 9 and directly irradiated forward. Some of the lights emitted from the LEDs 6 are distribution-controlled by being reflected by the reflective surfaces 8*f* of the reflector 8, and are irradiated forward through the cover 9. In this case, the shielding angle θ3 of the reflective surface 8*f* corresponding to the LED 6 on the outermost circle L3 is set to be greater than the shielding angles θ1 and θ2 of the LEDs 6 on the inner circles L1 and L2. Thus, the glare of the lighting apparatus 1 can be reduced.

Heat produced from the LEDs 6 is transmitted to a base 41 of a thermal radiator 4 mainly through the back of the substrate 7 and radiated from a plurality of radiator fins 42. Gaps 43M between main radiator fins 42M in the central portion can serve as air channels, since their opposite ends reach the peripheral portion of the base 41. Airflow from one peripheral edge portion to the other is produced by natural convection and cools the main radiator fins 42M, so that the thermal radiation performance is improved. Thus, the thermal radiation efficiency of the substrate 7 is improved, and the temperature distribution of the substrate 7 is homogenized. As regards the temperature distribution, heat tends to be concentrated on the central portion of the substrate 7 and bring it to a high temperature. In the present embodiment, the main radiator fins 42M of the radiator 4 serve to make the central portion of the substrate 7 higher in thermal radiation effect than the peripheral portion. The temperature distribution of the substrate 7 is generally homogenized. Since the temperature of the substrate 7 is equalized, a luminous flux obtained immediately after the LEDs 6 are turned on can be stabilized early. Further, the service life of the LEDs 6 can be prevented from shortening.

According to the present embodiment, as described above, the shielding angle θ3 of the reflective surface 8*f* corresponding to the LED 6 on the outermost circle L3 is set to be greater than the shielding angles θ1 and θ2 of the reflective surfaces 8*f* corresponding to the LEDs 6 on the inner circles L1 and L2. Thus, the glare of the lighting apparatus 1 can be reduced. Further, the thermal radiation efficiency of the substrate 7 on which the LEDs 6 are mounted is improved by the construction of the radiator 4, so that the temperature distribution of the substrate 7 can be homogenized more easily.

Figure 10:
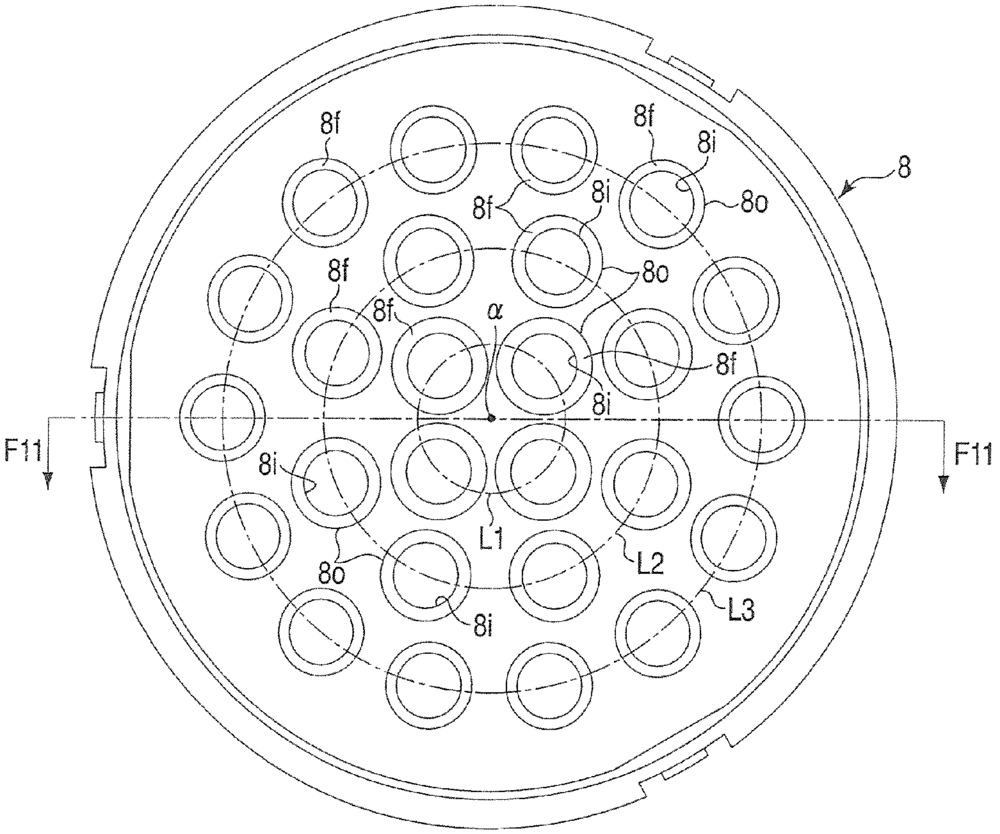
FIG. 10 is a front view showing a reflector of a lighting apparatus according to a second embodiment of the invention.

A reflector 8 of a lighting apparatus 1 according to a second embodiment of the invention will now be described with reference to FIGS. 10 and 11. Same reference numbers are used to designate same parts having the same functions as those of the reflector 8 of the lighting apparatus 1 according to the first embodiment, and a description of those parts is omitted. Further, the reflector 8 has incident apertures 8*i* as many as LEDs 6 provided in the lighting apparatus 1. There are 26 LEDs 6 in total, and they are located on a substrate 7. Four LEDs 6 are arranged at regular pitches on a circle L1, out of three concentric circles L1 to L3 with different radii, eight on the circle L2, and fourteen on the circle L3. Thus, the reflector 8 is provided with the incident apertures 8*i* so as to correspond to the LEDs 6, as shown in FIG. 8.

Figure 11:
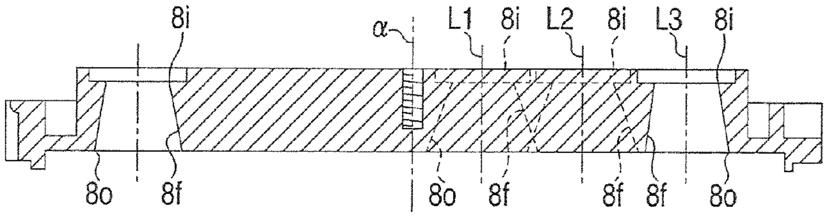
FIG. 11 is a sectional view of the reflector taken along line F11-F11 of FIG. 10.

As shown in FIG. 11, reflective surfaces 8*f* corresponding to the LEDs 6 are conical surfaces each spreading from each incident aperture 8*i* toward an emission aperture 8*o*. Thus, the shielding angle of the reflective surface 8*f* corresponding to each LED 6 is fixed without regard to the viewing direction. A shielding angle θ3 of the reflective surface 8*f* corresponding to the LED 6 on the outermost circle L3 is set to be greater than shielding angles θ2 and θ1 of the reflective surfaces 8*f* corresponding to the LEDs 6 on the inner circles L2 and L1. Further, a shielding angle θ2 of the reflective surface 8*f* corresponding to the LED 6 on the second circle L2 is greater than a shielding angle θ1 of the reflective surface 8*f* corresponding to the LED 6 on the first or innermost circle L1.

The emission apertures 8*o* of the reflector 8 of the first embodiment are sectorial apertures defined by the first and second separating walls 8*a* and 8*b*, outer peripheral edge portion 8*c*, and third separating walls 8*d*. On the other hand, the emission apertures 8*o* of the reflector 8 of the second embodiment are circular. Therefore, the shielding angles θ1 to θ3 of the reflective surfaces 8*f* are unchangeable without regard to the orientation of the observation point P. Thus, the reflective surfaces 8*f* can be designed and fabricated with ease.

A lighting apparatus 1 according to a third embodiment of the invention will now be described with reference to FIG. 12. Reflective surfaces 8*f* of a reflector 8 of this lighting apparatus 1, as same as the lighting apparatus 1 of the second embodiment, are conical surfaces. A shielding angle θ3 of the reflective surface 8*f* corresponding to the LED 6 on an outermost circle L3 is the greatest. A shielding angle θ2 of the reflective surface 8*f* corresponding to the LED 6 on a second circle L2 is the second greatest. A shielding angle θ1 of the reflective surface 8*f* corresponding to the LED 6 on a first or innermost circle L1 is the smallest.

Figure 12:
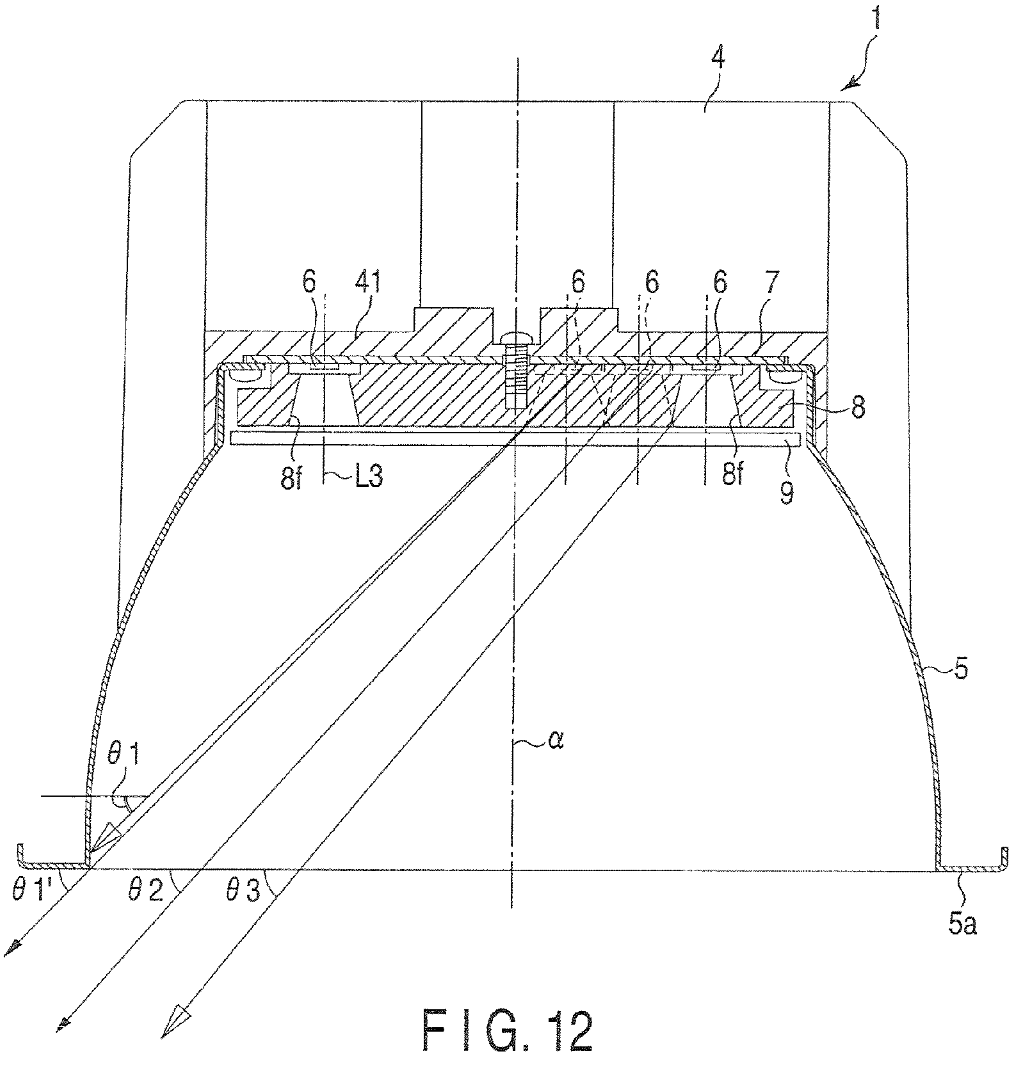
FIG. 12 is a sectional view showing a lighting apparatus according to a third embodiment of the invention.

As shown in FIG. 12, moreover, a blind member 5 is connected to a base 41 of a thermal radiator 4 in such a manner that the outer peripheral portion of a substrate 7 on which LEDs 6 are mounted is fastened to the radiator 4. After the substrate 7 is secured to the radiator 4, the reflector 8 is assembled to the base 41 with the substrate 7 therebetween by screws that are passed through the respective centers of the base 41 of the radiator 4 and the substrate 7.

A shielding angle θ1' is defined as an angle at which a light emitted from that one of the LEDs 6 which is located on the innermost circle L1 toward a center line α for the LEDs 6 is intercepted by the blind member 5. Further, a shielding angle θ1 is defined as an angle at which the light emitted from the LED 6 on the innermost circle L1 toward the center line α is intercepted by the reflective surface 8*f* corresponding to the LED 6 on the innermost circle L1. In the present embodiment, the shielding angle θ1' is set to be greater than the shielding angle θ1.

Glare attributable to the LEDs 6 located closer to the observation point than the center line α is entirely intercepted by the blind member 5 when the lighting apparatus 1 arranged in this manner is viewed from an observation point P sufficiently distant from the center line α. Further, the relations between shielding angles θ1 to θ3 of the reflective surfaces 8*f* corresponding to the LEDs 6 are set to be Θ3>θ2>θ1.

Specifically, glare attributable to the LEDs 6 in a region farther from the observation point P than the center line α is intercepted by their corresponding reflective surfaces 8*f*, when glare attributable to the LEDs 6 on the innermost circle L1 is intercepted by the blind member 5. Thus, glare emitted from the lighting apparatus 1 can be reduced.

Figure 13:
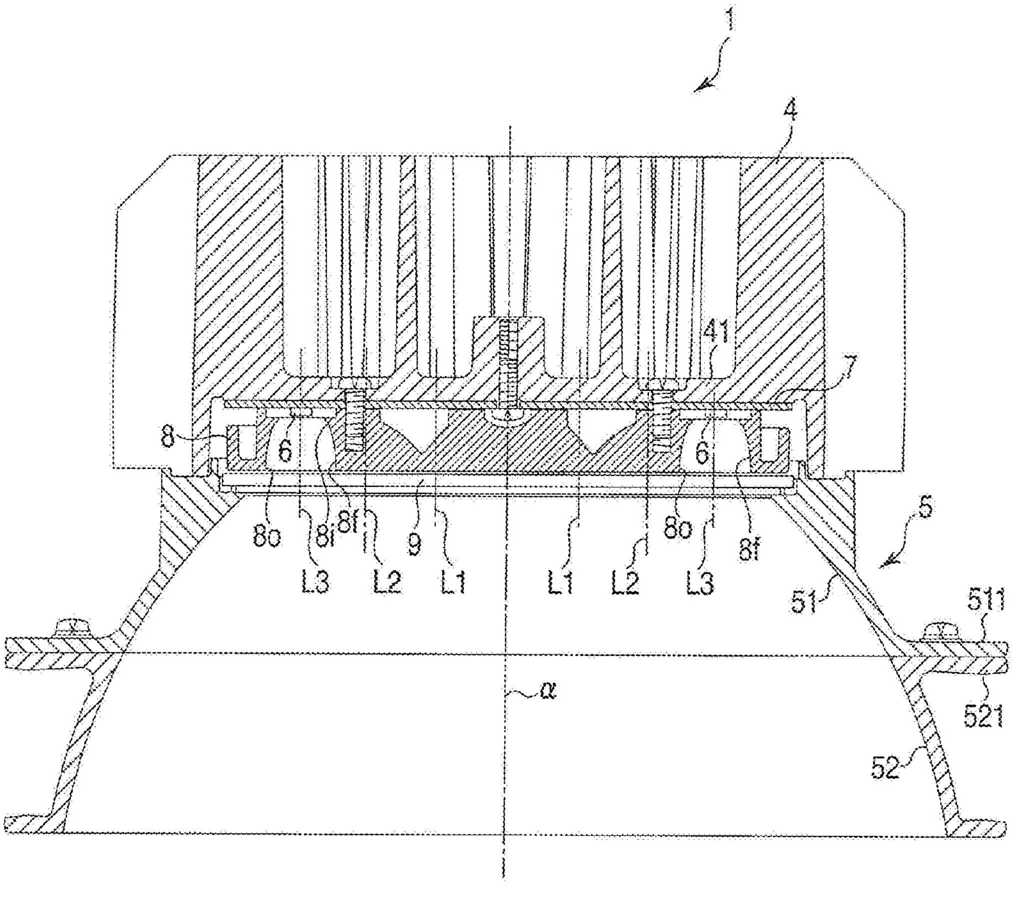
FIG. 13 is a sectional view showing a lighting apparatus according to a fourth embodiment of the invention.

A lighting apparatus 1 according to a fourth embodiment of the invention will now be described with reference to FIG. 13. A blind member 5 of this lighting apparatus 1 is different from that of the first embodiment. The blind member 5 is composed of a first blind member 51 and second blind member 52, which are divided away from the projection side of a substrate 7. The first and second blind members 51 and 52 are coupled to each other by flanges 511 and 521, which spread radially away from a center line α.

The length of the blind member 5 on the projection side where it extends away from the substrate 7 can easily be changed by replacing the second blind member 52, depending on the height from the floor to the ceiling C, space above the ceiling C, and other environmental conditions in which the lighting apparatus 1 is installed. Further, the first blind member 51 is the only member that needs to be accurately assembled with the reflector 8, translucent cover 9, radiator 4, etc. Since the length of the blind member 5 can be changed by only preparing second blind members 52 of different lengths, the manufacturing cost of the lighting apparatus 1 can be reduced.

Figure 14:
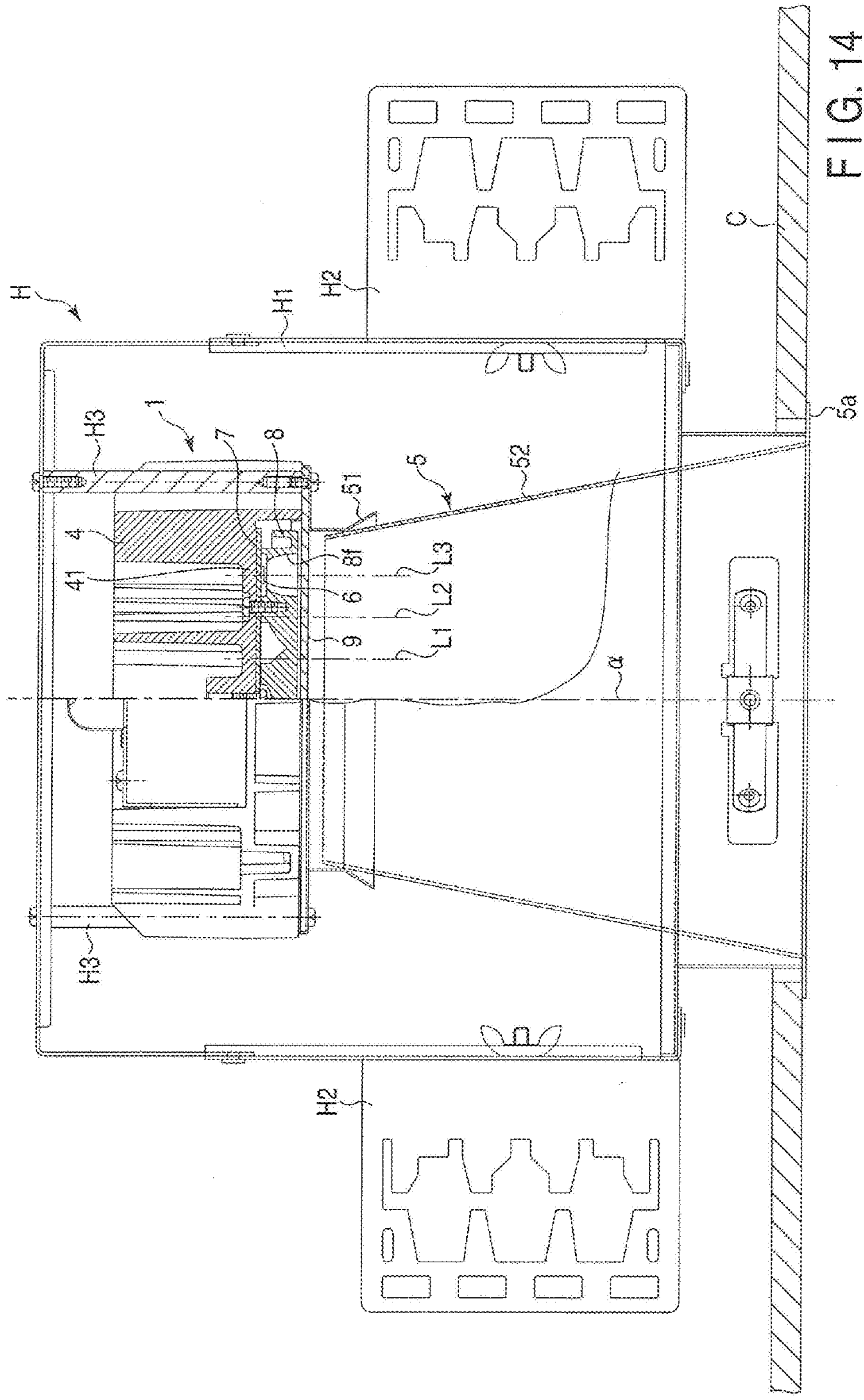
FIG. 14 is a sectional view showing a lighting apparatus according to a fifth embodiment of the invention.

A lighting apparatus 1 according to a fifth embodiment of the invention will now be described with reference to FIG. 14. This lighting apparatus 1 is contained in a housing H mounted above the ceiling C. The housing H is provided with a hull H1 enclosing the lighting apparatus 1 and a pair of brackets H2 mounted on the hull H1. Each bracket H2 is fixed to a beam on the ceiling C.

Further, the blind member 5 of the lighting apparatus 1 is composed of first and second blind members 51 and 52. The first blind member 51 is fixed together with a thermal radiator 4 to stems H3 that extend from the inner surface of the hull H1. The second blind member 52 is formed with a conical surface spreading toward the projection side. The second blind member 52 is inserted from the projection side into the first blind member 51 through a panel of the ceiling C. The second blind member 52 may be either secured to the ceiling C or coupled to the first blind member 51.

In this lighting apparatus 1, like that of the fourth embodiment, the overall length and shielding angle of the blind member 5 can easily be changed by replacing the second blind member 52 with another one with a different length, internal space, and angle. Thus, according to this lighting apparatus 1, the blind member 5 can be modified according to the installation environment, and glare can be reduced.

In each of the embodiments described herein, the LEDs 6, substrate 7, reflector 8, and translucent cover 9 may be unitized as a single light-emitting assembly. This light-emitting assembly includes a terminal and connector on the reverse side of the substrate 7 opposite from the projection side. The terminal is connected to the power circuit 31, while the connector is fitted to the base 41 of the radiator 4. A mounting portion of a main body of the apparatus is provided with sockets corresponding to the terminal and connector. The light emitter can be removed from the main body to the projection side. Thereupon, an illumination environment obtained by the lighting apparatus 1 can be changed by replacing the light-emitting assembly with one that is different in the color, luminance, and number of light-emitting devices and the shape of the reflective surfaces 8*f* of the reflector 8. In this case, the “illumination environment” includes brightness, light distribution properties, color rendering properties, and other factors that can change the appearance of an irradiation field created by lights applied by the lighting apparatus 1.

In the description of the other embodiments than the first embodiment, those parts which have not been described in detail are the same as those of the lighting apparatus 1 of the first embodiment. Same reference numbers are used to designate the parts having the same functions throughout the drawings. Therefore, those parts are explained based on the corresponding description. Those parts which are not shown or described are not essential to the invention. Thus, in each of these embodiments, the configurations that are not specifically described herein may be ones that resemble those of the first embodiment or alternative feasible ones for the lighting apparatus 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lighting apparatus comprising:

a plurality of light-emitting devices configured to emit light to an outside of the lighting apparatus;

a substrate comprising a light projection side, wherein the light-emitting devices are located on the light projection side;

a blind member which encloses an outermost periphery of the light-emitting devices and opens radially outward from the light projection side; and a reflector formed with a plurality of reflective surfaces corresponding to the light-emitting devices, individually, in such a manner that a shielding angle, at which a light emitted directly from one of the light-emitting devices which is located on the outermost periphery is intercepted by one of the reflective surfaces corresponding to the light-emitting device located on the outermost periphery, is greater than shielding angles at which light emitted directly from the light-emitting devices located inside the outermost light-emitting device is intercepted by the reflective surfaces corresponding to the inside light emitting devices, wherein the reflective surface corresponding to the outermost light-emitting device and the blind member are formed so that the light emitted directly from the light-emitting device located on the outermost periphery within a range farther from an observation point, which is distant at right angles to directions of emission of lights directly from the light-emitting devices, than a center of the light-emitting devices is intercepted by the reflective surface corresponding to the outermost light-emitting device when the light emitted from the light-emitting device located on an inside periphery within the range farther from the observation point than the center of the light-emitting devices is intercepted by the blind member.

2. A lighting apparatus according to claim 1, wherein the light-emitting devices are located on a plurality of concentric circles with different radii.

3. A lighting apparatus according to claim 1, wherein the shielding angle, at which the light emitted directly from the outermost light-emitting device toward the center of the light-emitting devices is intercepted by the reflective surface corresponding to the outermost light-emitting device, is greater than or equal to a shielding angle at which the light emitted directly from the light-emitting devices located inside the outermost light-emitting device toward a center of the light-emitting devices is intercepted by the blind member.

4. A lighting apparatus according to claim 1, wherein the blind member comprises a plurality of members connected in a direction away from a light projection side of the substrate.

5. A lighting apparatus according to claim 1, wherein a shielding angle, at which a light emitted directly from that one of the light-emitting devices which is located on an innermost periphery toward a center of the light-emitting devices is intercepted by the blind member, is greater than a shielding angle at which the light emitted directly from the light-emitting device located on the innermost periphery toward the center of the light-emitting devices is intercepted by a reflective surface corresponding to the inside light-emitting device.

* * * * *